United States Patent
Itoh

[11] Patent Number: 6,033,986
[45] Date of Patent: Mar. 7, 2000

[54] SEMICONDUCTOR DEVICE HAVING AN ANTI- REFLECTIVE FILM ON AN INTERCONNECT LINE AND A METHOD FOR MANUFACTURING THE SAME

[75] Inventor: Katsuya Itoh, Yokkaichi, Japan

[73] Assignee: Kabushiki Kaisha Toshiba, Kawasaki, Japan

[21] Appl. No.: 08/820,531

[22] Filed: Mar. 19, 1997

[30] Foreign Application Priority Data

May 31, 1996 [JP] Japan .................................... 8-138349

[51] Int. Cl.⁷ ...................................... H01L 21/44
[52] U.S. Cl. ........................ 438/673; 438/713; 438/720; 438/945
[58] Field of Search ..................... 438/669, 597, 438/720, 673, 710, 739, 713, 945

[56] References Cited

U.S. PATENT DOCUMENTS 4,919,748  4/1990  Bredbenner et al. .
5,174,856  12/1992  Hwang et al. .
5,277,757  1/1994  Sato .

FOREIGN PATENT DOCUMENTS 2-143425  6/1990  Japan .

Primary Examiner—Caridad Everhart
Attorney, Agent, or Firm—Finnegan, Henderson, Farabow, Garrett & Dunner, L.L.P.

[57] ABSTRACT

A barrier metal film, Al alloy film and anti-reflective film are sequentially deposited on a surface to form an interconnect pattern by a photolithography technique. An overhanging portion of the anti-reflective film is etched away by a plasma of a $Cl_2/BCl_3$-mixed gas. Then an insulating interlayer is deposited on a resultant semiconductor structure.

10 Claims, 4 Drawing Sheets

SEMICONDUCTOR DEVICE HAVING AN ANTI- REFLECTIVE FILM ON AN INTERCONNECT LINE AND A METHOD FOR MANUFACTURING THE SAME

BACKGROUND OF THE INVENTION

The present invention relates to a semiconductor device having an anti-reflective film on an interconnect line and a method for manufacturing the same and, in particular, to a dry etching method for forming such an interconnect configuration as to allow an insulating interlayer to be deposited between interconnect lines in a general MOS product, such as a MOS memory product and MOS logic product and a semiconductor device manufactured using such method.

In a semiconductor integrated circuit such as a MOS memory product and MOS logic product, a high integration density has recently been further advanced and the design size of the interconnect line is of the order of below 1 μm. With this advance, it has been becoming difficult to directly pattern the resist film coated on an interconnect material, such as aluminum, by a photolithography technique. That is, when the circuit pattern is transferred by an exposure apparatus to the resist film, the side wall of the patterned resist film is exposed with light reflected by an interconnect material of an underlying film. For this reason, the shaping of the pattern varies, thus leading to a fall in the accuracy of the pattern.

Normally, an anti-reflective film of a lower reflectivity material is deposited on the interconnect material and the resist film is coated on the anti-reflective film and patterned by photolithography technique. In this case, it is possible to prevent light from being reflected on the underlying film upon patterning.

If, on the other hand, the RIE (reactive ion etching) characteristic of the anti-reflective film is prominently different from that of the interconnect material providing the underlying film, then it is not possible to etch the anti-reflective film and interconnect material at one RIE step and it is necessary to effect the etching of the anti-reflective film and that of the interconnect material in separate steps and separate chambers. It is considered convenient to be able to use an anti-reflective film spin-coatable as the resist film. For the case of the interconnect material being an aluminum film, however, the RIE characteristic of the spin-coatable anti-reflective film becomes different from that of the aluminum film. This necessitates etching the anti-reflective film and interconnect material in separate steps and hence increasing the number of steps of forming the interconnect line. From this viewpoint, use is normally made, as an anti-reflective film for the aluminum film, of the material TiN etchable together with the aluminum film.

FIGS. 4A to 4C are cross-sectional views showing a conventional interconnect line forming process.

First, a well, not shown, is formed in a semiconductor substrate 11, an element isolation area, not shown, is formed by an LOCOS method for instance, and a gate oxide film, gate electrode and source/drain structure are formed to provide a transistor.

Then an insulating film 5 is deposited on the whole surface of a semiconductor substrate 11 and contact holes, not shown, are opened, a Ti film of, for example, 20 nm thick is deposited on the whole surface and a TiN film of, for example, 70 nm thick is formed on the Ti film. A barrier metal 4 is formed with the Ti film and TiN film. An Ag alloy film 3 of, for example, 600 nm thick is deposited on the barrier metal film 4 and a TiN film 2 of, for example, 30 nm thick is deposited on the Al alloy film 3. The TiN film 2 serves as an anti-reflective film.

A resist film 1 of, for example, 1500 nm thick is coated on the anti-reflective film 2 and patterned by the photolithography technique. FIG. 4A shows a cross-sectional view showing a semiconductor device structure at that stage of manufacture.

Then the anti-reflective film 2, Al alloy film 2 and barrier metal film 4 are etched, by the RIE technique, with the resist film 1 used as a mask. FIG. 4B is a cross-sectional view showing the semiconductor device at this stage of manufacture. Upon the etching of the Al alloy film 3, a decomposition product of the resist film 1 is created, by slightly etching the resist film 1 by virtue of the RIE method, so that the product is deposited on the side wall of the Ag alloy film 2 being etched to provide a side wall protection film 6. For this reason, the Al alloy film 3 is etched anisotropically. At the initial stage of etching the Al alloy film, however, the decomposition product of the resist film 1 is not adequately supplied to the side wall of the Al alloy film. For this reason, the Al alloy film 3 immediately below the anti-reflective film 2 is etched, to some extent, in a direction parallel to the substrate 11. As a result, the anti-reflective film 2 has a broader width than that of the immediately underlying Al alloy film 3 and extends, for example, about 50 nm, sideway relative to the Al alloy film 3, a state which will be referred to, hereinafter, as an "overhanging" state.

Then the resist film 1 is removed and a silicon oxide film of, for example, 1300 nm thick is deposited, by a plasma-CVD (chemical vapor deposition) method, as an insulating interlayer 7, on the resultant semiconductor structure. FIG. 4C is a cross-sectional view showing a semiconductor device at this stage of manufacture. Upon the removal of the resist film, the decomposition product, that is, the side wall protection film 6, of the resist film is removed to expose the overhanging type anti-reflective film 2. The insulating interlayer 7 formed by the CVD method faithfully reflects the shape of the interconnect line to be buried. For this reason, the insulating interlayer 7 is grown, while reflecting the overhanging shape, so that a void 8 is created in the insulating interlayer 7 between adjacent interconnect lines. Such void 8, upon the planarization of the insulating interlayer 7, is exposed on the surface of the insulating interlayer 7. In this case, such void is groove-like and, if a second interconnect line is formed as it is, there is a possibility that there will occur a breakage in the second interconnect layer or a short-circuiting of the interconnect line due to the interconnect material entering in the groove.

If necessary, a multi-level interconnect structure is formed and a passivation film is deposited.

In this way, the anti-reflective film, being so overhung, creates voids, thus presenting a problem.

BRIEF SUMMARY OF THE INVENTION

It is accordingly the object of the present invention to provide a semiconductor device, and a method for the manufacture of the same, which improves the shape of an anti-reflective film and thereby to prevent a void from being created in an insulating interlayer.

According to one aspect of the present invention, there is provided a method for manufacturing a semiconductor device comprising the steps of:

sequentially depositing a barrier metal film, aluminum alloy film and anti-reflective film over an insulating film deposited on a semiconductor substrate;

coating a resist film on the anti-reflective film and patterning the resist film by a photolithography technique;

etching the anti-reflective film, aluminum alloy film and barrier metal film with the resist film used as a mask to form interconnect lines;

removing an overhanging portion of the anti-reflective film relative to an uppermost portion of the aluminum alloy film; and depositing an insulating film in a way to bury the anti-reflective film, aluminum alloy film and barrier metal film therewith.

According to another aspect of the present invention there is provided a semiconductor device comprising:

interconnect line means having a lower surface and upper surface narrower in width than the lower surface in which an angle defined between the lower surface and a side surface joining an end of the lower surface and end of the upper surface is below 90°; and an anti-reflective film provided on the interconnect line means and having a narrower width than that of the upper surface of the interconnect line means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be explained in more detail below with reference to the accompanying drawing.

Figure 1A:
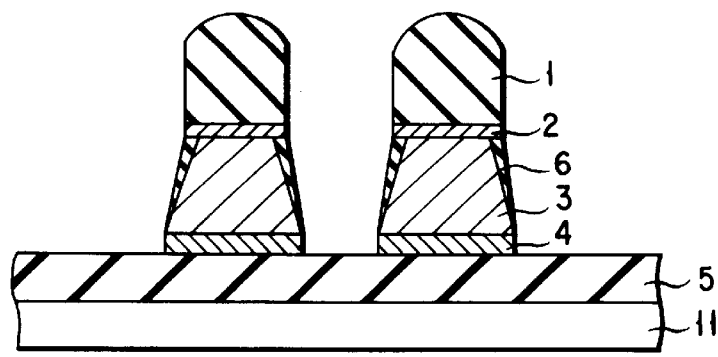
FIGS. 1A to 1C, each, are cross-sectional views showing a first embodiment of the present invention.
Figure 1B:
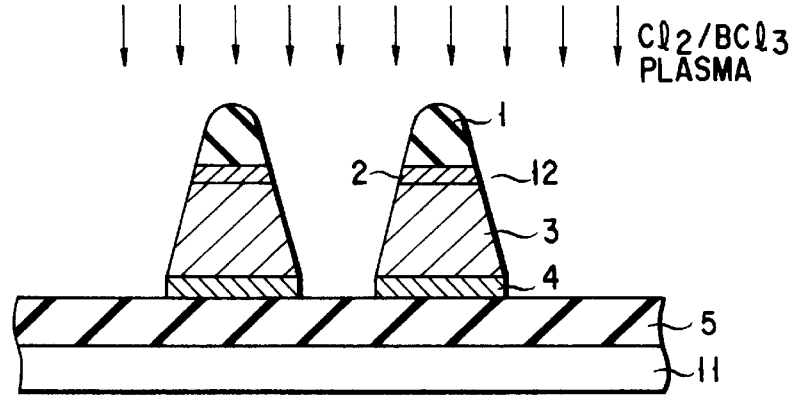
Figure 1C:
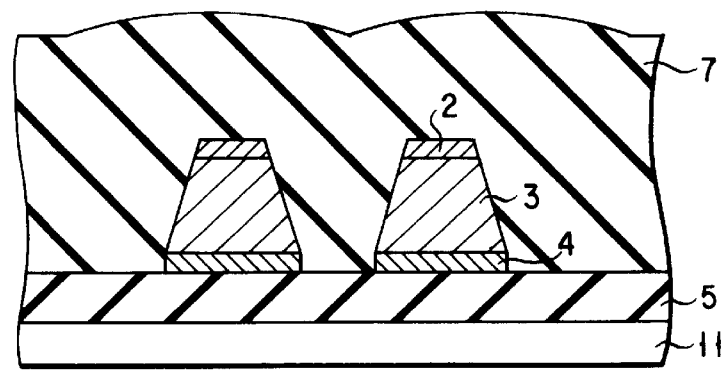

FIGS. 1A to 1C show a first embodiment of the present invention. Throughout the drawing, the same reference numerals are employed to designate like parts or elements and any further explanation is, therefore, omitted for brevity's sake.

First, a well, not shown, is formed in a semiconductor substrate 11 and an element isolation area, not shown, is formed by a LOCOS method for example. A gate oxide film, gate electrode and a source/drain structure, not shown, are formed at an element area to provide a transistor not shown.

Then an insulating film 5 is deposited on the whole surface of the substrate 11 and contact holes, not shown, are opened in the insulating film 5. Further, a Ti film of, for example, 20 nm thick, TiN film of, for example, 70 nm thick, Al alloy film 3 of, for example, 600 nm thick and TiN film of, for example, 30 nm thick are sequentially formed over the insulating film 5 and contact holes. The initially deposited Ti and TiN films serve as a barrier metal film 4. The finally deposited TiN film acts as an anti-reflective film 2.

Then, a resist film 1 of, for example, 1500 nm thick is coated on the anti-reflective film 2 and patterned by a photolithography technique. With the resist film 1 used as a mask, the anti-reflective film 2, Al alloy film 3 and barrier metal film 4 are etched by an RIE technique using the plasma of a $Cl_2/BCl_3$-mixed gas. At a time of etching, a decomposition product of the resist film 1 is created due to the slight etching of the resist film 1 by the plasma and is deposited on the side wall of the Al alloy film being etched to provide a side wall protection film 6. FIG. 1A a cross-sectional view showing a semiconductor device structure at this stage of manufacture.

Thereafter, within the same RIE apparatus, the semiconductor device structure is exposed with the plasma of the $Cl_2/BCl_3$ gas. At this time, the plasma of the $Cl_2/BCl_3$ gas is created under the conditions of, for example, an RF power of 300 W, pressure of 30 m Torrs and $Cl_2/BCl_3$=60 SCCM/ 76 sccm. The $Cl_2/BCl_3$-mixed gas is used as a gas for working these films 2, 3 and 4 under the RIE process, but is so conditioned that it is quicker in the etching of the resist film than in that of the metal stacked layer structure as set out above. For example, the condition comprises the use of a lower pressure than the working condition of the metal stacked layer structure, or the use of a lower partial pressure of the $Cl_2$ gas, or the use of a gas mixed with a He gas, etc. The resist film 1 is etched by ions in the plasma. The etching is started from the resist film above an end of the anti-reflective film 2. With the resist film 1 receded by the etching, the anti-reflective film 2 and side wall protection film 6 are exposed with the ions in the plasma. Since the anti-reflective film 2 is also etched under the above mentioned conditions, it is etched from its upper end side. The side wall protection film 6 is also etched. FIG. 1B is a cross-sectional view showing a semiconductor device structure at this stage of manufacture. The anti-reflective film 2 ceases to overhang and the side surface of the metal layer stacked structure comprised of the anti-reflective film 2 and Al alloy film 3 creates a normal tapering structure. That is, the normal tapering structure is such that the Al alloy film 3 is narrower at its upper surface than at its lower surface and that an angle of a side surface, that is, a surface defined by connecting an end of its upper surface to an end of its lower surface, is below 90° and that the anti-reflective film 2 provided on the Al alloy film 3 is narrower in width than the Al alloy film 3.

The side wall of the Al alloy film 3 is protected by the side wall protection film 6 formed of a decomposition product of the resist film and, since the etching proceeds downward from above, the Al alloy film 3 is etched sideway only to such an extent that the anti-reflective film 2 does not overhang. Under the above-mentioned etching conditions, the side wall protection film 6, together with the resist film 1, is normally etched. Although the underlying film ($SiO_2$) is also exposed with the $Cl_2/BCl_3$-mixed gas, since the etching rate of the $SiO_2$ under the gaseous plasma generation condition as set out above is as slow as 50 nm/min., no underlying film 5 is extremely etched even when it is exposed with the $Cl_2/BCl_3$ gaseous plasma for a short time period.

Then, the resist film 1 is removed. An insulating interlayer 7 of, for example, 1300 nm thick is deposited between the interconnect layers, or on the interconnect line, and the metal interconnect lines are buried with the insulating interlayer 7. FIG. 1C is a cross-sectional view showing a semiconductor device structure at this stage of manufacture. Since the overhanging of the TiN film 2 is eliminated, any void resulting from such overhanging is not produced in the insulating interlayer 7.

A multi-layered structure is formed on that semiconductor structure as required and a protective film is deposited thereon to complete a semiconductor device. In the formation of such multi-layered structure, it is needless to say that it is possible to apply the etching method of the present invention.

According to the present invention, as set out above, the overhanging portion of the anti-reflective film is removed, by the plasma etching, after the formation of the interconnect lines, so that the side surface of the interconnect lines becomes a normal tapering shape. By doing so it is possible to form an insulating interlayer free of any voids and to prevent any breakage and any short-circuiting, to such interconnect lines over the insulating interlayer.

Figure 1D:
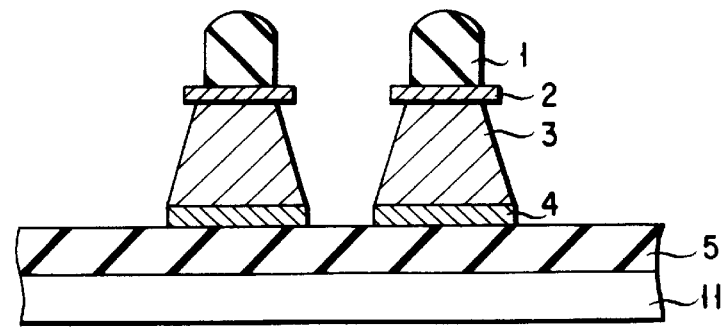
FIG. 1D is a cross-sectional view showing a modified example of the first embodiment.

According to the above-mentioned embodiment, although the resist film is fully left as it is after the formation of such interconnect lines and the overhanging portion of the TiN film is eliminated by subjection to the plasma, the present invention is not restricted thereto. For example, the resist film 1 may be isotropically etched by an $O_2$ ashing as shown in FIG. 1D or the interconnect lines may be exposed with the plasma after the resist film has been fully removed. Even in this case, it is possible to eliminate the overhanging portion of the TiN film and thus obtain the same effect as in the first embodiment.

According to the above-mentioned embodiment, the RIE process is performed by using the plasma of the $Cl_2/BCl_3$ gas. It is also possible to use the plasma of the $Cl_2/BCl_3/Ar$ ga-and thus obtain the same effects as in the first embodiment.

FIGS. 2A to 2D show a second embodiment of the present invention.

Figure 2A:
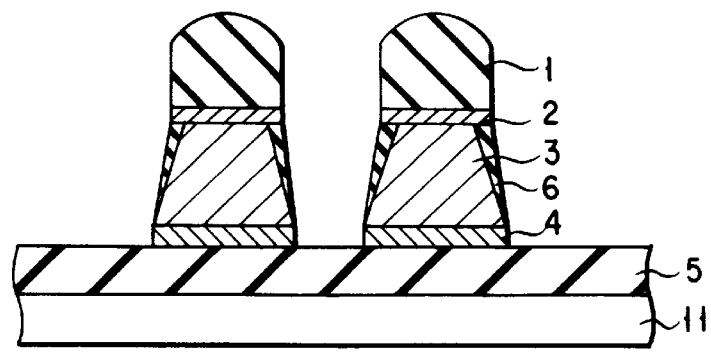
FIGS. 2A to 2D, each, are cross-sectional views showing a second embodiment of the present invention.

First, an insulating film 5 is deposited on a substrate 11 including transistors, etc. and contact holes, not shown, are opened there. Then a barrier metal film 4 of Ti/TiN, Al alloy film 3 and TiN film 2 serving as an anti-reflective film are sequentially deposited over the insulating film 5 to provide a metal layer stacked structure. Then a resist film 1 of, for example, 1500 nm thick is coated on the anti-reflective film 2 and patterned by a photolithography technique. The metal layer stacked structure (films 2, 3, 4) is etched by an RIE method with the resist film 1 used as a mask. FIG. 2A is a cross-sectional view showing a semiconductor device structure at this stage of manufacture.

Then, the resist film 1 is subjected by an $O_2$ plasma to ashing and the resist film 1 and side wall protection film 6 are removed.

Figure 2B:
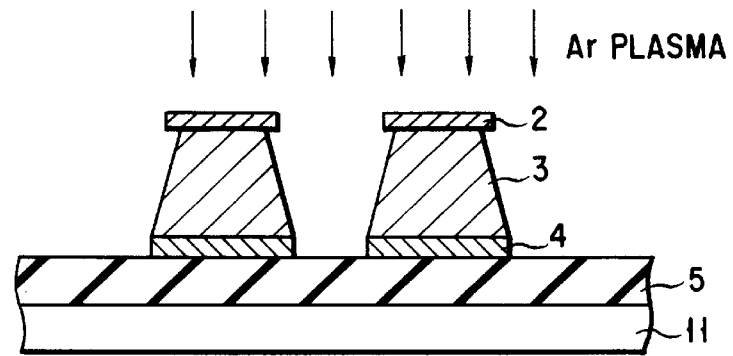
Figure 2C:
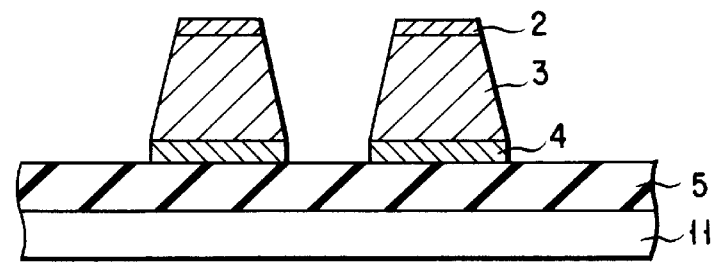

Then the resultant semiconductor device structure is exposed with an Ar plasma. FIG. 2B is a cross-sectional view showing a semiconductor device structure at this stage of manufacture. The generation conditions of the Ar plasma comprise, for example, the use of an RF power of 300 W, pressure of 30 m Torrs and Ar=100 sccm. The overhanging portion of the $TiN_2$ is removed by this processing. The Ar has an atomic weight of 39 and is a relatively heavy gas and the sputtering effect by the Ar plasma is high. An overhanging portion in particular of the anti-reflective film 2, being directly exposed with the Ar plasma, is readily eliminated. Further, the Ar, being a rare gas, reveals a lower reactivity with a metal, such as an Al alloy film 3. For this reason, the side portion of the Al alloy film 3 is not etched by the Ar plasma, so that the interconnect line becomes a normal tapering shape free of any overhanging portion. FIG. 2C is a cross-sectional view showing a semiconductor device structure at this stage of manufacture.

Figure 2D:
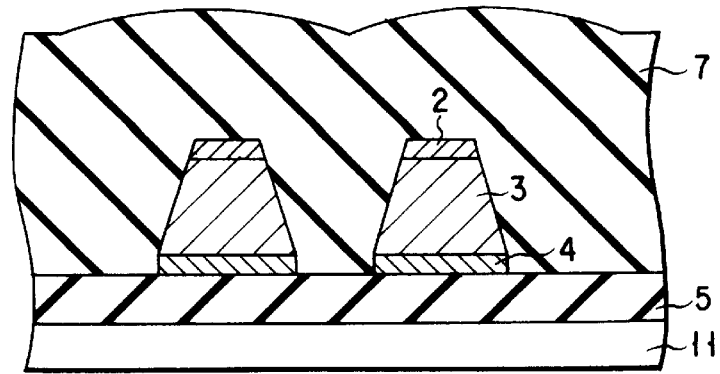

Then an insulating interlayer 7 is deposited between interconnect lines and on the interconnect line and the interconnect line is buried with the insulating interlayer 7. At that time, no voids are produced in the insulating interlayer 7. FIG. 2D is a cross-sectional view showing a semiconductor device at this time of manufacture.

Further, if necessary, a multi-level interconnect line is provided and a passivation film is deposited on the multi-level interconnect line. Even in the formation of the multi-level interconnect line, it is needless to say that it is possible to use the etching method of the present invention.

According to the present embodiment, since the overhanging portion of the anti-reflective film is removed by the Ar plasma after the formation of the interconnect line, the side surface of the interconnect line becomes a normal tapering shape, so that it is possible to form an insulating interlayer free of any voids and hence to prevent any breakage and any short-circuiting to the interconnect lines formed over the insulating interlayer.

According to the present embodiment, although the Ar plasma has been explained as being used so as to remove the overhanging portion of the anti-reflective film, use may be made of a plasma of a rare gas, such as He, of a poor reactive gas, such as $O_2$ or $N_2$, or of a gas mixed therewith. Even in this case, it is possible to remove the overhanging portion of the anti-reflective film and to obtain the same effect as in the second embodiment.

FIGS. 3A to 3D show a third embodiment of the present invention.

Figure 3A:
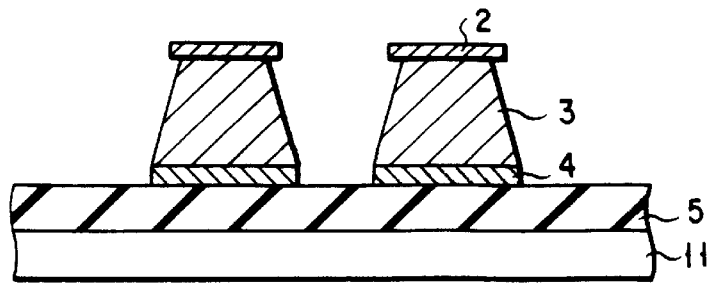
FIGS. 3A to 3D, each, are cross-sectional views showing a third embodiment of the present invention.

First, transistors, etc., are formed at a substrate 11, an insulating film 5 is deposited on the substrate 11 and contacts, not shown, are opened there. Then a barrier metal film 4 of Ti/TiN, Al alloy film 3 and anti-reflective film 2 of TiN are sequentially deposited over the insulating film 5. A resist film 1 of, for example, 1500 nm thick is coated on the anti-reflective film 2 and patterned by the photolithography technique. Then the metal layer stacked structure (metal films 2, 3, 4) is etched, by a $Cl_2/BCl_3$-mixed gas, with the resist film 1 used as a mask. By doing so, these metal films 2, 3 and 4 are worked to provide a normal tapering shape. The resist film 1 is subjected by an $O_2$ plasma to ashing, thereby removing the resist film and side wall protection film. The manufacturing process thus far explained is the same as that of the above-mentioned second embodiment. FIG. 3A is a cross-sectional view showing a semiconductor device structure at this stage of manufacture.

Figure 3B:
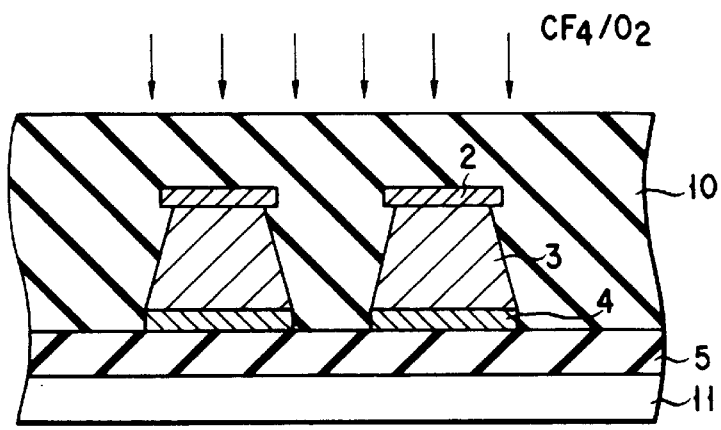

Subsequently, the resist film 10 is coated on a whole surface of a resultant structure. The interconnect lines are buried with the resist film 10. At that time, the surface of the resist film 10 is substantially planarized, but the resist film surface over the interconnect lines are somewhat higher than at a marginal side. The resist film 10 is etched back by a CDE (chemical dry etching) method using a $CF_4/O_2$-mixed gas. FIG. 3B is a cross-sectional view showing a semiconductor device structure at this stage of manufacture. The conditions of the CDE method are, for example, an RF power of 700 W, pressure of 300 m Torrs, $CF_4/O_2$=150 sccm/60 sccm and stage temperature of 60° C. The TiN film 2 is etched by the CDE step using a $CF_4/O_2$-mixed gas. In the CDE processing, etching proceeds in an isotropical fashion, so that the anti-reflective film 2 is removed around from its end. Since the resist film 10 is buried between the interconnect lines, the barrier metal film 4 containing the TiN film is not etched by the CDE processing. The Al alloy film 3 is not etched by a fluorine-based gas so that its configuration does not vary by the CDE process. In this way, the overhanging portion of the anti-reflective film 2 is eliminated by the CDE process.

Figure 3C:
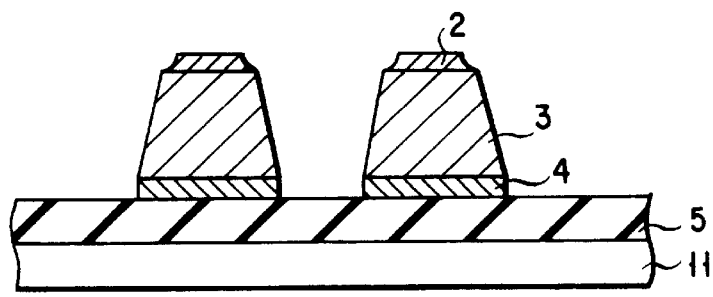
Figure 3D:
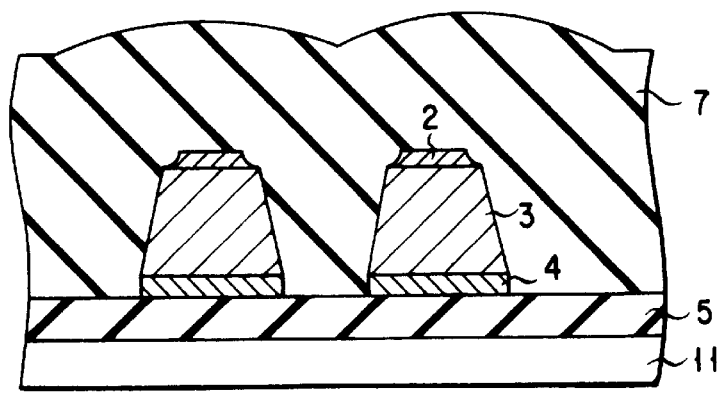
Figure 4A:
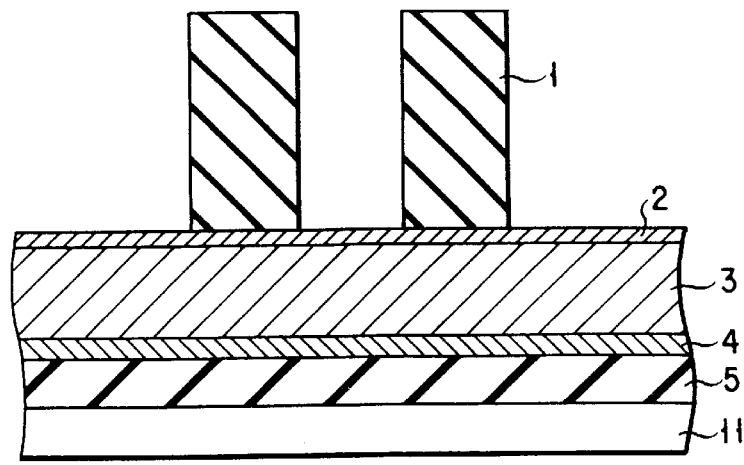
FIGS. 4A to 4C, each, are cross-sectional views showing a conventional device.
Figure 4B:
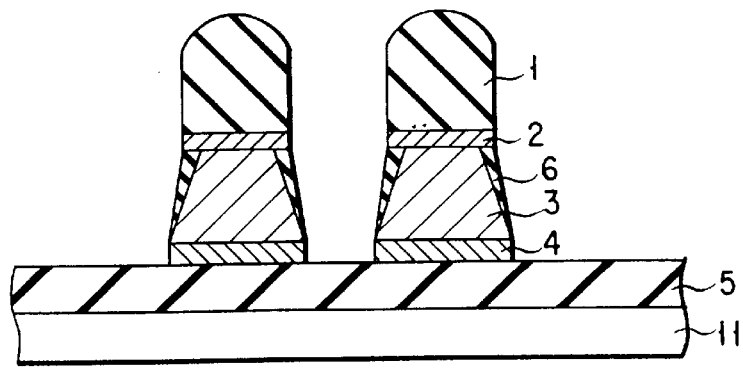
Figure 4C:
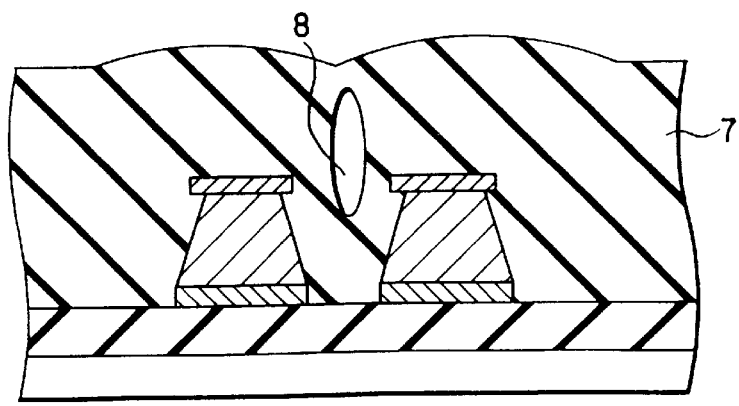

Thereafter, the remaining resist film 10 is subjected by an $O_2$ gas to ashing and removed. At this time, a $CF_4$ gas is not used so as not to have the barrier metal etched therewith. Instead, use is made of the $O_2$ gas only. The conditions of the $O_2$ ashing are, for example, an RF power of 700 W, pressure of 300 m Torrs, $O_2$=200 sccm and stage temperature of 60° C. FIG. 3C is a cross-sectional view showing a semiconductor device structure at this stage of manufacture.

Then the insulating interlayer 7 is deposited between the interconnect lines and over the interconnect lines to have them buried therewith. By doing so, a semiconductor device is completed. Even in the formation of the multi-level interconnect lines, it is needless to say that the etching method of the present invention can also be used.

According to the present embodiment, therefore, the overhanging portion of the anti-reflective film is removed and the side surface of the interconnect line becomes a normal taper shape. As a result, it is possible to form an insulating interlayer free of any voids and thus to prevent a breakage, etc., to the interconnect lines to be formed over the insulating interlayer.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A method for manufacturing a semiconductor device comprising the steps of:

sequentially depositing a barrier metal film, aluminum alloy film and TiN film over an insulating deposited on a semiconductor substrate;

coating a resist film on the TiN film and patterning the resist film by a photolithography technique;

etching the TiN film, aluminum alloy film and barrier metal film with the resist film used as a mask to form interconnect lines;

removing an overhanging portion of the TiN film relative to an uppermost portion of the aluminum alloy film, while leaving the TiN film formed on a remaining portion of the aluminum alloy film; and depositing an insulating film to bury the TiN film, aluminum alloy film and barrier metal film therewith.

2. The method according to claim 1, wherein the step of removing an overhanging portion of the TiN film is carried out by a reactive ion etching method.

3. The method according to claim 1, wherein the step of removing an overhanging portion of the TiN film is carried out by a chemical dry etching method.

4. A method for manufacturing a semiconductor device comprising the steps of:

sequentially depositing a barrier metal film, aluminum alloy film and TiN film on an insulating deposited on a semiconductor substrate;

coating a resist film on the TiN film and patterning the resist film by a photolithography technique;

etching the TiN film, aluminum alloy film and barrier metal film;

removing an overhanging portion of the TiN film relative to an uppermost portion of the aluminum alloy film, while leaving the TiN film formed on a remaining portion of the aluminum alloy film; and depositing an insulating film to bury the TiN film, aluminum alloy film and barrier metal film therewith.

5. The method according to claim 4, wherein the step of removing an overhanging portion of the TiN film is carried out by a reactive ion etching method.

6. The method according to claim 4, wherein the step of removing an overhanging portion of the TiN film is carried out by a reactive ion etching method using a $Cl_2/BCl_3$-mixed gas.

7. The method according to claim 4, wherein the step of etching the TiN film and barrier metal film is carried out by a reactive ion etching method using a $Cl_2/BCl_3$-mixed gas; and the step of removing an overhanging portion of the TiN film is carried out by a reactive ion etching method using a $Cl_2/BCl_3$-mixed gas selected from the group consisting of under a low pressure, under a low partial $Cl_2$ gas pressure and in a form mixed with an inert gas, in comparison with conditions of said reactive ion etching method.

8. The method according to claim 4, wherein the step of removing an overhanging portion of the TiN film is carried out by irradiating the TiN film with any one of a plasma of a single gas selected from the group consisting of Ar, He, $O_2$ and $N_2$ and a plasma of the single gas mixed therewith, after the resist film has been removed.

9. The method according to claim 4, wherein the step of removing an overhanging portion of the TiN film is carried out by a chemical dry etching.

10. The method according to claim 4, wherein the step of removing an overhanging portion of the TiN film comprises:

removing the resist film;

depositing a second resist film in a way to bury the TiN film therewith; and while etching back the second resist film, removing at least one portion of the TiN film by a chemical dry etching method using a $CF_4/O_2$-mixed gas.

* * * * *